(12) United States Patent
Kaneda et al.

(10) Patent No.: US 6,309,280 B1
(45) Date of Patent: Oct. 30, 2001

(54) METHOD OF GRINDING SEMICONDUCTOR ARTICLES

(75) Inventors: Yukihiro Kaneda; Shuichi Takizawa, both of Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/372,162

(22) Filed: Aug. 11, 1999

(30) Foreign Application Priority Data

Sep. 8, 1998 (JP) .................................................. 10-253606

(51) Int. Cl.[7] ........................................................ B24B 1/00
(52) U.S. Cl. ............................ 451/41; 441/259; 441/268; 441/269; 441/397; 441/398
(58) Field of Search .................................... 451/259, 268, 451/269, 397, 398

(56) References Cited

U.S. PATENT DOCUMENTS

| | | | |
|---|---|---|---|
| 3,811,183 | * 5/1974 | Celling | 29/588 |
| 4,749,120 | * 6/1988 | Hatada | 228/123 |
| 5,299,091 | * 3/1994 | Hoshi et al. | 361/723 |
| 5,843,251 | * 12/1998 | Tsukagoshi et al. | 156/64 |
| 5,920,769 | * 6/1999 | Ball et al. | 438/113 |
| 5,977,641 | * 11/1999 | Takahashi et al. | 257/778 |

* cited by examiner

Primary Examiner—Joseph J. Hail, III
Assistant Examiner—Shantese McDonald
(74) Attorney, Agent, or Firm—Arent Fox Kintner Plotkin & Kahn

(57) ABSTRACT

Disclosed is a method of grinding semiconductor articles comprising the steps of: dicing a semiconductor wafer having bumps formed on one surface into individual chips or pellets; putting the pellets on a printed-wiring board with their flat, bump-less surfaces up; bonding the bumps of the pellets to the electrodes of the printed-wiring board; and grinding the flat, bump-less surfaces of the pellets simultaneously so that they may have a predetermined reduced thickness. The grinding post bonding has the advantageous effect of preventing pellets from being broken or fractured.

2 Claims, 5 Drawing Sheets

FIG. 2
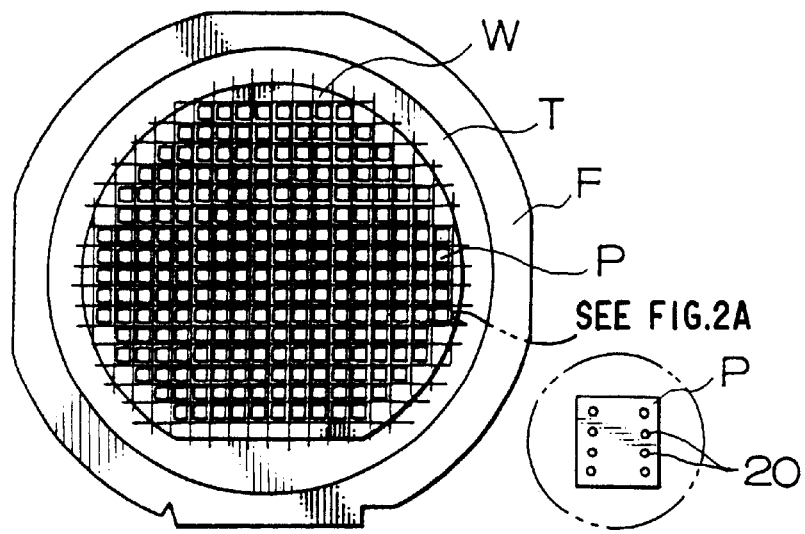
FIG.2A
FIG. 3
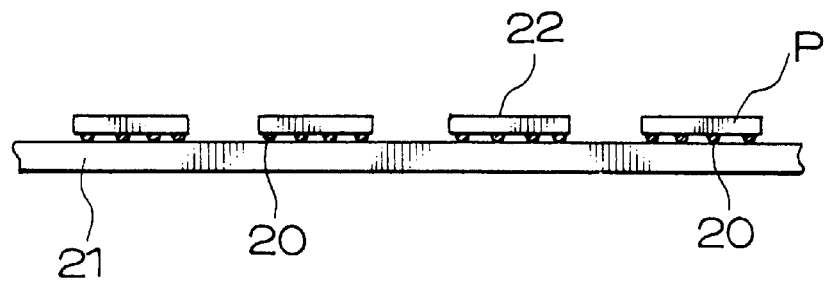
FIG. 4
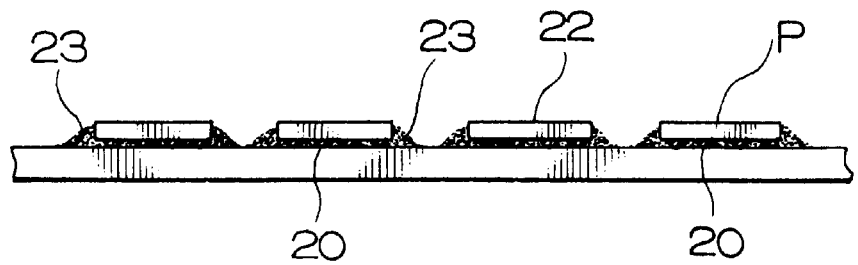

FIG. 5
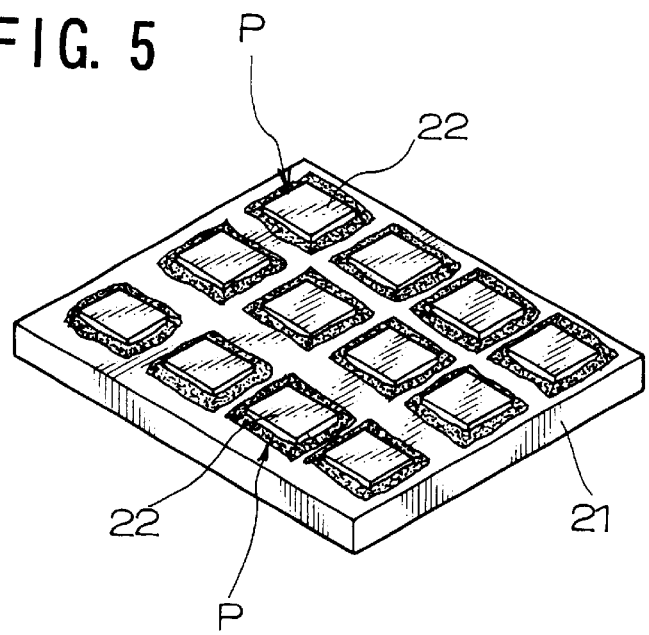
FIG. 6
FIG. 6A
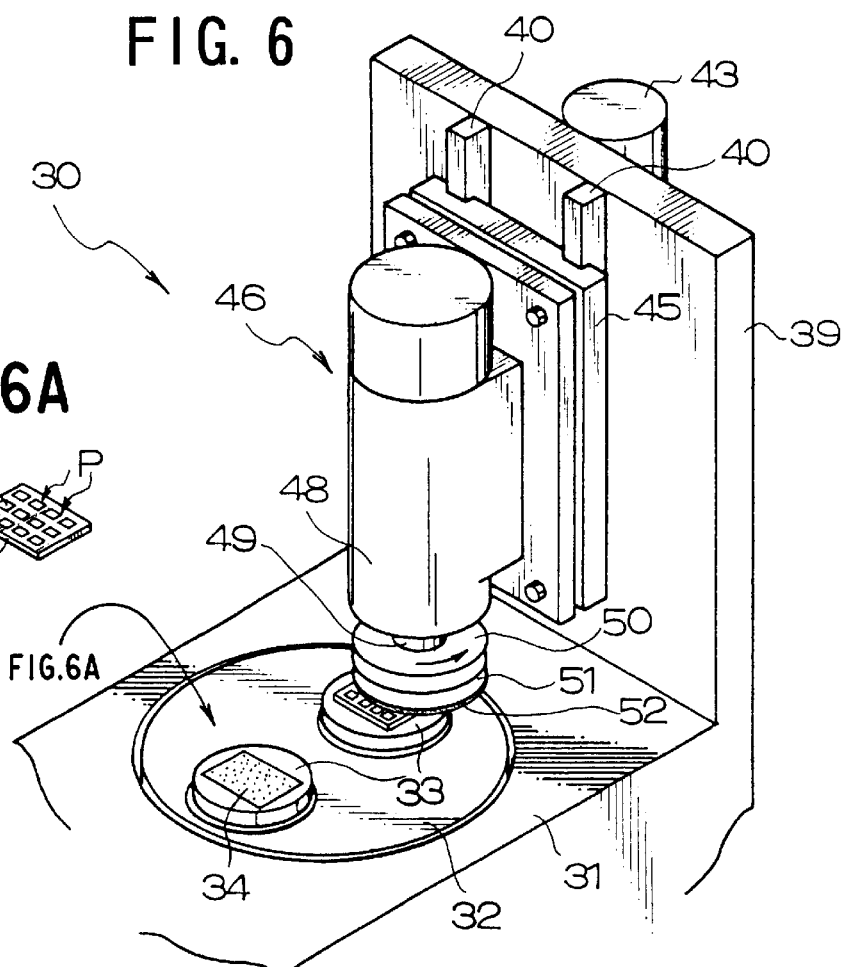

METHOD OF GRINDING SEMICONDUCTOR ARTICLES

BACKGROUND OF THE INVENTION

1. Field of the Invention

The present invention relates to a method of grinding a semiconductor wafer having bumps formed on one surface, particularly grinding the bump-free surface of the semiconductor wafer so that the wafer may be reduced to a predetermined thickness.

2. Related Arts

Referring to FIG. 8, a plurality of chips or pellets each having an integrated circuit pattern formed thereon can be provided by cutting a semiconductor wafer W along crosswise streets S to separate it into small squares. Prior to dicing the rear surface of the semiconductor wafer is ground a predetermined thickness to reduce its heat storage capacity. Also, this meets the downsizing requirement.

Referring to FIG. 9, the front surface 61 of the semiconductor wafer W is laid and sucked onto the chuck table 62 of a grinder, and a rotary whetstone 63 is applied to the rear surface 60 of the semiconductor wafer W under a predetermined pressure.

The grinding can be equally effected no matter which type of semiconductor pellets may be, pellets to be packaged for surface-mounting such as chip size packages (CSPs) or ball grid arrays (BGAs) or bare chips to be mounted on printed-wiring boards.

Such pellets P, however, have bumps formed thereon for making required connections to selected electrodes in printed-wiring boards. The semiconductor wafer W is ground while being laid on the chuck table 62 with its rear, bump-free surface up. As the semiconductor wafer W is pushed against the chuck table 62, it is liable to be broken by the stress, which will be caused by the bumps as a counter force to the push given to the semiconductor wafer W by the rotary whetstone 63.

In an attempt to prevent the semiconductor wafer from being broken an adhesive tape 64 is applied to the front surface of the semiconductor wafer W, thereby allowing the bumps to be buried in the thickness of adhesive layer, as seen from FIG. 10. The adverse effect, however, cannot be reduced completely with recourse to this remedy, and what is worse is that: adhesive agent is apt to remain more or less on the semiconductor wafer W after removal of the tape 64 from the semiconductor wafer, thus lowering the quality of pellets significantly.

After bonding the bumps of a pellet to selected electrodes of a printed-wiring board the space between the printed board and the pellet is usually filled with resin, thereby solidifying the pellet-and-printed board combination. To assure that a good electric connection be established between each bump and the counter electrode it is necessary that the bump is 0.09 mm tall, but to reduce substantially the possibility of the semiconductor wafer being broken it is necessary that the bump is 0.05 or less tall. Disadvantageously this necessity is a cause for incomplete bonding between bumps and electrodes, leading to disconnection between the printed circuit and pellets.

SUMMARY OF THE INVENTION

One object of the present invention is to provide a method. of grinding semiconductor articles without causing any breakage on the semiconductor wafer or contamination with adhesive agent in spite of using bumps tall enough to assure good bonding between, bumps and electrodes.

To attain this object a method of grinding semiconductor articles according to the present invention comprises the steps, of: dicing a semiconductor wafer having bumps formed on one surface to separate individual pellets; putting the pellets on a, printed-wiring board with their flat, bump-less surface up; bonding each pellet to a selected area of the printed-wiring board via its bumps, thus providing a pellet-and-board combination; and holding fixedly the pellet-and-board combination on the chuck table of a grinder to grind the flat, bump-less surfaces of the pellets until they have a predetermined reduced thickness.

The printed-wiring board may be a board whose surface is alloted for mounting electronic parts and devices.

After the pellets are bonded to the printed-wiring board, their flat, bump-less surfaces are subjected to grinding, and therefore, the force applied to each pellet by the rotary whetstone is distributed over the whole surface of the printed-wiring board, thus preventing any breakage of pellet which, otherwise, would be caused by allowing the force to be localized to the bumps of the pellet. No source for contamination such as adhesive agent exists, and the height of bumps need not be reduced to prevent the semiconductor wafer from being broken.

All pellets of the semiconductor wafer can be ground simultaneously to one and same thickness, and therefore, it is assured that all pellets have equal thickness as required for the final products.

The grinding of pellets follows the dicing, and therefore, minute chippings which were produced in dicing can be removed from the pellets while being ground.

Other objects and advantages of the present invention will be understood from the following description of a semiconductor article grinding method according to the present invention, which is illustrated in accompanying drawings.

BRIEF DESCRIPTION OF THE DRAWING

FIG. 2 is a plane view of a semiconductor wafer to be diced by the dicing apparatus of FIG. 1;

FIG. 3 is a side view of a CSP wiring board having semiconductor pellets bonded thereon;

FIG. 4 is a similar side view of the CSP wiring board whose pellet-to-board space is filled with resin;

FIG. 5 is a perspective view of the CSP wiring board whose pellet-to-board space is filled with resin;

FIG. 6 is a perspective view of the major grinding part of the grinder;

DETAILED DESCRIPTION OF PREFERRED EMBODIMENT

The present invention is described below by referring to the case in which: semiconductor chips or pellets are bonded to a CSP wiring board; the space between the pellets and the board are filled with resin; and the upper surfaces of the pellets are grounded.

Figure 1:
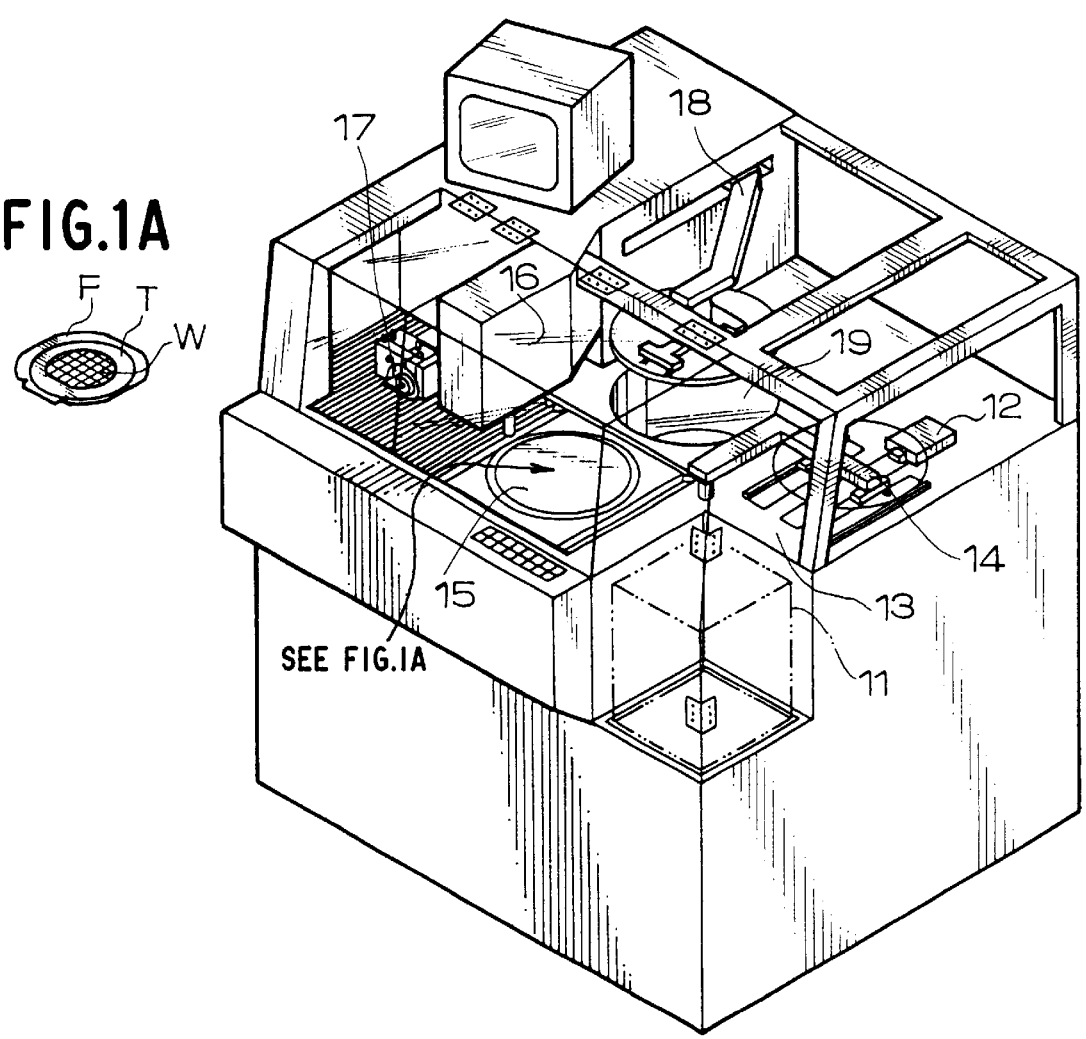
FIG. 1 is a perspective view of a dicing apparatus to which the grinding method according to the present invention can be applied.

Referring to FIG. 1, a dicing apparatus 10 is used in dicing semiconductor wafers. All semiconductor wafers W are attached to carriers or frames F by adhesive tapes T, and the wafer-and-frame combinations are laid on each other in a cassette 11.

A selected wafer-and-frame combination is transported from the cassette 11 to a preliminary storage area 13 by carrier means 12, and then the wafer-and-frame combination is sucked to first transporting means 14. The first transporting means 14 turns to bring the wafer-and-frame combination to a chuck table 15. When the wafer-and-frame combination is put on the chuck table 15, it is sucked and held firmly thereon.

Then, the chuck table 15 is moved in the X-axis direction to put the wafer-and-frame combination just below alignment means 16 so that the crosswise streets S may be detected by means of the pattern matching process. Thus, a rotary blade 17 is put in alignment with a selected street S in the Y-axis direction. Thereafter, the chuck table 15 is moved in the X-axis direction to permit the rotary blade 15 to cut the semiconductor wafer W along the selected street S.

The cutting is repeated crosswise along the streets S to separate the semiconductor wafer W into small squares or pellets as seen from FIG. 2 (Dicing Step). Each pellet P has a plurality of bumps 20 as seen from the encircled part of FIG. 2.

The diced wafer-and-frame combinations are transported by a second transporting means 18 to a washing station 19, in which they are washed. Thereafter, they are dried by spinning, and the dry articles are transported by the first transporting means 14 to be laid in the tentative storage area 13. Finally they are transported to the cassette 11 by the carrier means 12.

Diced wafer-and-frame combinations are taken out one after another from the cassette 11, and pellets P are removed from the adhesive tapes T (Picking-up step). Each pellet P is laid on a CSP wiring board 21 with its bumps 20 put on selected electrodes of the board 21, and the bumps 20 are soldered to the electrodes, as seen from FIG. 3.

Different from the conventional order in which the bonding step follows the grinding step, the bonding is performed before the bump-less surfaces of the pellets P are grounded, and therefore, each pellet P remains to be thick enough to resist both to the pressure which is applied to the pellet P in bonding, and the stress which appears between the pellet P and the CSP wiring board 21 due to thermal expansion. Thus, there is no fear that pellets P are broken or fractured in bonding.

When the pellets P are bonded to the CSP wiring board 21, the space equal to the height of bumps 20 appears between the pellets P and the CSP wiring board 21 (see FIG. 3). The space is filled with resin 23 to fix the pellets firmly to the CSP wiring board 21, making sure of the electric conduction between each bump and the counter electrode (see FIG. 4: Integrating step).

After finishing the dicing and integrating steps in the order named, CSP wiring boards 21 each having a plurality of pellets P mounted thereon result as shown in FIG. 5. The flat or bump-less surfaces of the semiconductor pellets or semiconductor articles P can be ground by the grinder 30 as shown in FIGS. 6 and 7.

Referring to FIG. 6, the grinder 30 has a turn table 32 on its bed 31, and the turn table 32 has two chuck tables 33 thereon. Each chuck table 33 has a suction area 34 formed therein, and a selected CSP wiring board 21 is laid and sucked on the suction area 34 with the flat or bump-less surface of each pellet P up. The chuck table 33 can be rotated by a servo drive 36 and associated encoder 37 under the control of a CPU 35, as seen from FIG. 7.

Figure 7:
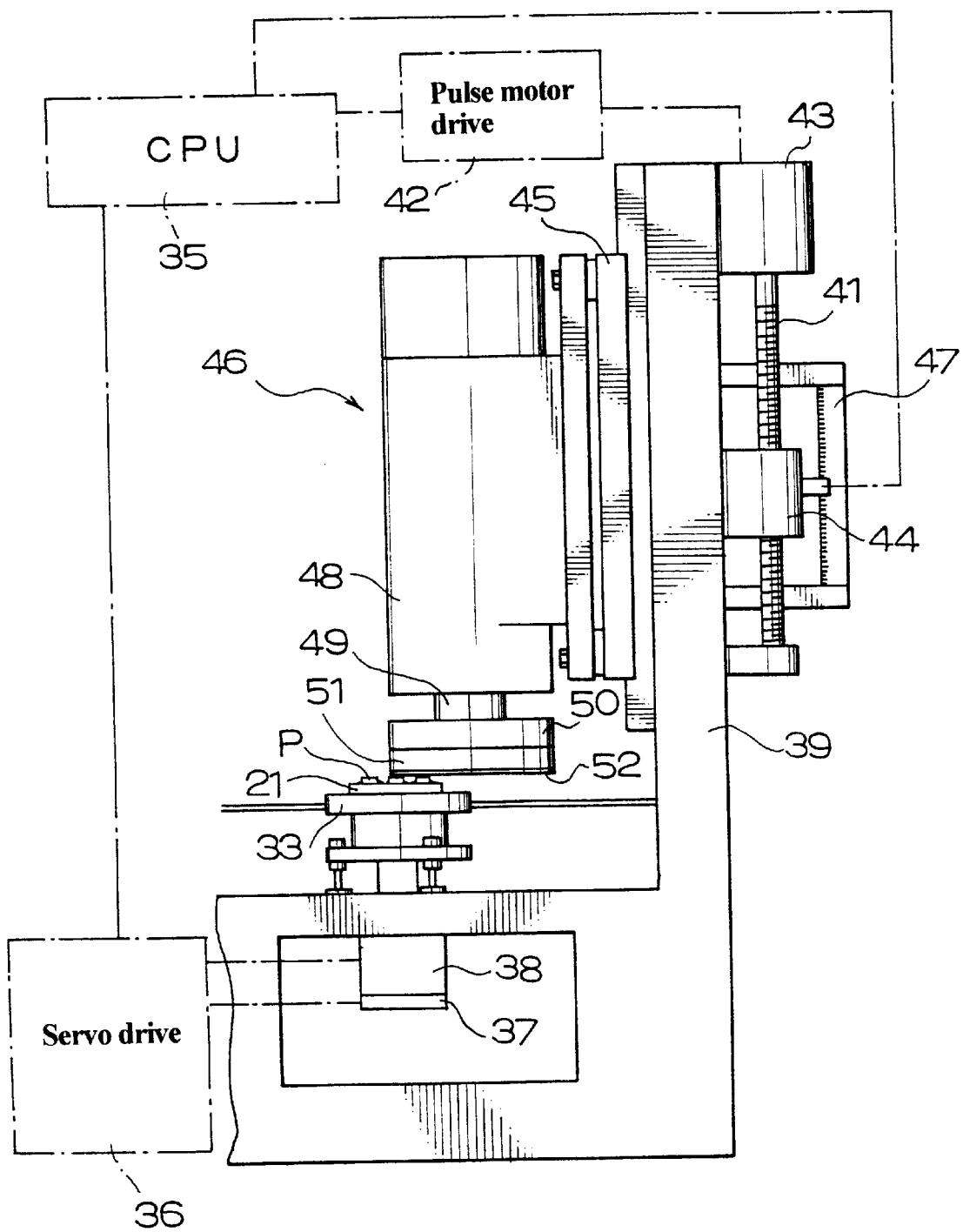
FIG. 7 shows the structure of the grinder.
Figure 8:
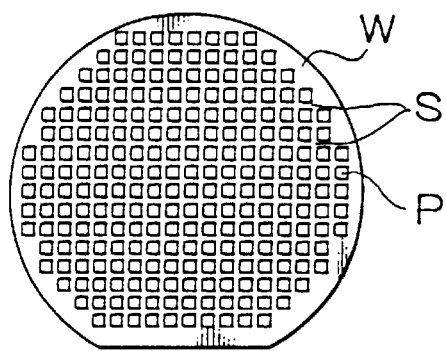
FIG. 8 is a plane view of a semiconductor wafer.
Figure 9:
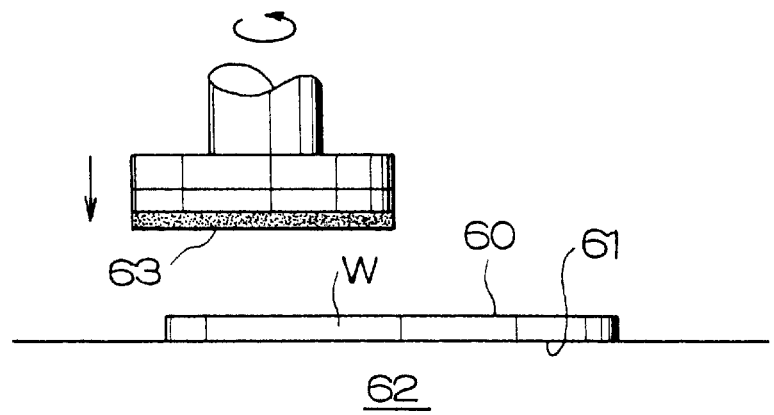
FIG. 9 illustrates how the rear surface of the semiconductor wafer can be ground.
Figure 10:
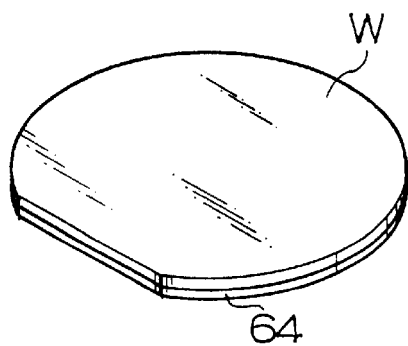
FIG. 10 is a perspective view of a semiconductor wafer having an adhesive tape applied on one side for protecting its bumps.

Referring to FIG. 7, an upright wall 39 stands on the rear side of the bed 31, and the upright wall 39 has two parallel rails 40 fixed to its front side. The upright wall 39 has a screw rod 41 vertically extending on its rear side. The screw rod 41 is connected to an associated pulse motor 43, which is driven by a pulse motor drive 42 under the control of the CPU 35. A movable block 44 is threadedly engaged with the screw rod 41. When the pulse motor 42 is rotated under the control of the CPU 35, the screw rod 41 is rotated to raise or lower the movable block 44. The movable block 44 is connected to a slide plate 45 on the front side of the upright wall 39. The slide plate 45 rides on the parallel rails 40, carrying a grinding unit 46. With this arrangement rotation of the screw rod 41 moves the grinding unit up and down through the agency of the movable block-and-slide plate combination.

The vertical position of the movable block 44 can be determined from a linear scale 47, which is fixed to the rear side of the upright wall 39. The CPU is responsive to the instantaneous position of the grinding unit 46 given in terms of the scores of the linear scale 47 for effecting precision control on the vertical movement of the grinding unit 46.

As seen from FIGS. 6 and 7, the grinding unit 46 has a rotary spindle 49 in its housing 48, and the rotary spindle 49 has a grinding wheel 51 attached to its tip via an associated mount 50. A grinding whetstone 52 appears partly from the grinding wheel 51.

When the upper surfaces 22 of the pellets P are ground by the grinding apparatus 30, two CSP wiring boards 21 are laid and sucked on the suction areas 34 of the chuck tables 33 respectively.

The turn table 32 is rotated such an angle that a selected CSP wiring board 21 may be put just under the grinding unit 46. The grinding unit 46 is lowered by rotating the spindle 49 to abut against the pellets P, thereby permitting their upper surfaces to be ground one and same amount with the whetstone 52 (Grinding Step).

All pellets P are attached to the CSP wiring board 21 by soldering their bumps to the electrodes of the board 21 and by filling the pellet-to-board space with resin, and therefore, the stress which is caused by applying the whetstone 52 to the upper surfaces of the pellets P will be distributed evenly over the whole surface of the underlying board 21. Thus, no pellets P can be broken or fractured while they are being ground, and therefore, pellets can be ground to be thinner than hitherto permitted. No adhesive tape is required for protecting bumps, and therefore, there is no fear that the quality of semiconductor products may be deteriorated due to the remaining adhesive agent.

Advantageously it is unnecessary that the height of bumps be reduced below that required, say, 0.09 to 0.10 mm high for fear of breakage of pellets, which otherwise, would be often caused in grinding as experienced in the conventional method. Thanks to the pre-bonding and resin sealing neither breakage of pellets nor disconnection between electrodes and bumps can be caused.

Also, advantageously the simultaneous grinding of pellet-and-board combinations permits individual semiconductor articles to have equal thickness precisely controlled, and therefore, all semiconductor products can be evenly of high-quality.

The grinding post dicing permits removal from the pellets of minute chippings which are produced in the course of dicing.

In this particular embodiment the method according to the present invention is described as being applied to a CPS wiring board having semiconductor pellets attached to its surface. It can be equally applied to a BGA wiring board or a flip chip board.

In place of bonding-and-resin filling bumps may be bonded to counter electrodes by an isotropic conductor.

What is claimed is:

1. A method of grinding semiconductor articles comprising the steps of:
   (a) dicing a semiconductor wafer having bumps formed on one surface to separate individual pellets;
   (b) after step (a), putting the individual pellets on a printed-wiring board with their flat, bump-less surfaces up so that each bump abuts on a selected area of the printed-wiring board to form a space between the individual pellets and the printed-wiring board;
   (c) after step (b), bonding each pellet to the selected area of the printed-wiring board via its bumps;
   (d) after step (c), filling the space with a resin and curing the resin whereby the pellets are firmly fixed to the printed-wiring board to provide a pellet-and-wiring board combination as a single solid body; and
   (e) after step (d), holding fixedly the pellet-and-wiring board combination on a chuck table of a grinder to grind the flat, bump-less surfaces of the pellets to a predetermined reduced thickness.

2. A method of grinding semiconductor articles according to claim 1 wherein the printed-wiring board is a board whose surface is allotted for mounting parts.

* * * * *